United States Patent [19]

Chan et al.

[11] Patent Number: 5,132,562
[45] Date of Patent: Jul. 21, 1992

[54] PUSH-PULL DRIVER WITHOUT INPUT SATURATION OR OUTPUT LEAKAGE

[75] Inventors: Francis Chan, Fishkill; George J. English, Poughkeepsie; Bijan Salimi, Saugerties; David R. Weitzel, Poughkeepsie, all of N.Y.

[73] Assignee: International Business Machines Corporation, Armonk, N.Y.

[21] Appl. No.: 724,144

[22] Filed: Jul. 1, 1991

[51] Int. Cl.$^5$ .............................................. H03K 5/00
[52] U.S. Cl. ................................... 307/443; 307/254; 307/454; 307/270
[58] Field of Search ............... 357/254, 270, 440, 443, 357/454, 456, 475

[56] References Cited

U.S. PATENT DOCUMENTS

| | | | |
|---|---|---|---|
| 4,347,446 | 8/1982 | Price | 307/443 |
| 4,376,900 | 3/1983 | Metzger | 307/473 |
| 4,394,588 | 7/1983 | Gaudenzi | 307/443 |
| 4,476,403 | 10/1984 | Allen | 307/475 |
| 4,490,631 | 12/1984 | Kung | 307/456 |
| 4,506,176 | 3/1985 | Harris | 307/557 |
| 4,874,970 | 10/1989 | Coy et al. | 307/475 |

Primary Examiner—Robert J. Pascal
Attorney, Agent, or Firm—Whitham & Marhoefer

[57] ABSTRACT

A bipolar push-pull driver in which the input transistor is biased so that it does not saturate and the base of its associated output transistor is pulled down to shut off compeletely by a transistor switch controlled by the complimentary output of the other input transistor.

3 Claims, 3 Drawing Sheets

PUSH-PULL DRIVER WITHOUT INPUT SATURATION OR OUTPUT LEAKAGE

BACKGROUND OF THE INVENTION

1. Field of the Invention

The present invention generally relates to a push-pull digital driver circuit, and more particularly to a bipolar driver with feedback to eliminate simultaneously input saturation and output leakage.

2. Description of the Prior Art

Push-pull digital driver circuits are well known and widely used in the digital electronics art. The following patents are examples of prior art circuits.

U.S. Pat. No. 4,347,446, entitled "Emitter Coupled Logic Circuit With Active Pull-Down", discloses a emitter coupled logic gate incorporating an active pull-down transistor in the pull-down circuit with bias connections for the pull-down transistor including components in the differential input circuit of the gate so that the pull-down transistor is active only during a HIGH-to-LOW transition of the output logic signal.

U.S. Pat. No. 4,490,631, entitled "Totem Pole/Open Collector Selectable Output Circuit", discloses a Schottky driver in which the output circuitry is pin selectable totem pole or open collector configuration. Means for reduced propagation delay are present along with means for reducing totem pole current spikes and overall current drain.

U.S. Pat. No. 4,506,176, entitled "Comparator Circuit", discloses a comparator circuit which compares an input voltage signal with a referenced voltage in order to produce a logical signal at the output of the circuit.

U.S. Pat. No. 4,376,900, entitled "High Speed, Non-Saturating, Bipolar Transistor Logic Circuit", discloses a bipolar transistor logic circuit comprising an input terminal for receiving digital logic signals, an output terminal, an output driver including a current sink transistor and a current source transistor, and a control stage coupled between the input terminal and the output driver.

U.S. Pat. No. 4,874,970, entitled "ECL Output With Darlington or Common Collector-Common Emitter Drive", discloses an output drive circuit having an input circuit comprising a differentially coupled pair of transistors. The output of the differentially paired transistors is provided to a pair of output driver transistors connected in a Darlington or a common collector-common emitter configuration which provides an output pull-up signal to an output pin of the integrated circuit containing the described output driver. The opposite output of the differentially coupled pair is provided to a circuit which provides a pull-down pulse to quickly shut off the transistor pair during the high-to-low transition of the output driver transistor.

U.S. Pat. No. 4,476,403, entitled "Low-Level Logic to High-Level Logic Translator Having Improved High State Drive", discloses a Level Converter circuit, converting from a low-level logic voltage to a high-level logic signal using TTL circuit topology.

Two problems common to prior art circuits are input saturation and output leakage. The present invention can be understood most readily with reference to the prior art push-pull digital driver circuit shown in FIG. 1. In this prior art push-pull bipolar driver, complimentary inputs may be coupled to the bases of bipolar NPN switching transistors TA2 and TA3 via the input nodes PA2 and PA3, respectively. It will be appreciated that this circuit is also suitable for operation with a single input signal coupled to node PA3. In this case, node PA2 is coupled to a fixed reference potential. In either case, the collector of TA3 (node COT) is coupled to the base of an upper output transistor pair TT1 and TT2 and the collector of TA2 (node COC) is coupled to the base of a lower output transistor pair TB1/TB2. A positive potential VCC is connected to terminal 10 and a negative potential VEE is connected to terminal 12. Transistor 17 whose base is coupled to a voltage VX provides a constant current source for TA2 and TA3, and transistor 14 in combination with voltage divider 16 regulates the COT node potential when TA3 is on. Transistor TLS level shifts the signal at node COC and transistor 18 provides a constant current to transistor TLS when TLS is on. Transistor 22 establishes the down level of output terminal P51.

As will be appreciated by those skilled in the art, the degree of saturation of transistor TA3 is a function of the forward bias of the junction between input node PA3 (TA3 base) and node COT (TA3 collector). With output node P51 at its down level ($-0.5V$), node COT should be pulled down low enough to shut off completely the top output transistor pair TT1-TT2. To insure complete turn-off of the top output transistor pair, the base-collector junction (PA3−COT) of transistor TA3 must be heavily forward biased. But the input capacitance after saturation increases exponentially with increasing forward bias. The saturation capacitance, and hence the switching delay for the driver, is difficult to model and therefore predict. Input saturation of a driver that introduces unpredictable delay to the previous stage can cause system failure.

The problem of saturation can be avoided by limiting the forward bias of the transistor to a value below the saturation region. However, in prior art drivers of the type illustrated in FIG. 1, raising the voltage at collector node COT to reduce the forward bias of transistor TA3 in order to reduce saturation, increases the leakage through output transistor pair TA1-TA2 in an exponential manner. Thus, it will be appreciated that input saturation and output leakage are distinct but inter-related problems with prior art push-pull drivers.

SUMMARY OF THE INVENTION

An object of this invention is the provision of a push-pull driver circuit which quickly switches off the output transistor without leakage therethrough and without saturating the input switching transistor. Another object of the invention is provision of a push-pull driver circuit which provides design freedom to fine tune the circuit to match challenging performance requirements.

Briefly, this invention contemplates the provision of a bipolar push-pull driver of the type shown in FIG. 1 in which one input transistor is biased so that it does not saturate and the base of its associated output transistor is pulled down to shut off completely by a transistor switch controlled by the complementary output of the other input transistor.

BRIEF DESCRIPTION OF THE DRAWINGS

The foregoing and other objects, aspects and advantages will be better understood from the following detailed description of a preferred embodiment of thee invention with reference to the drawings, in which.

DETAILED DESCRIPTION OF A PREFERRED EMBODIMENT OF THE INVENTION

Figure 1:
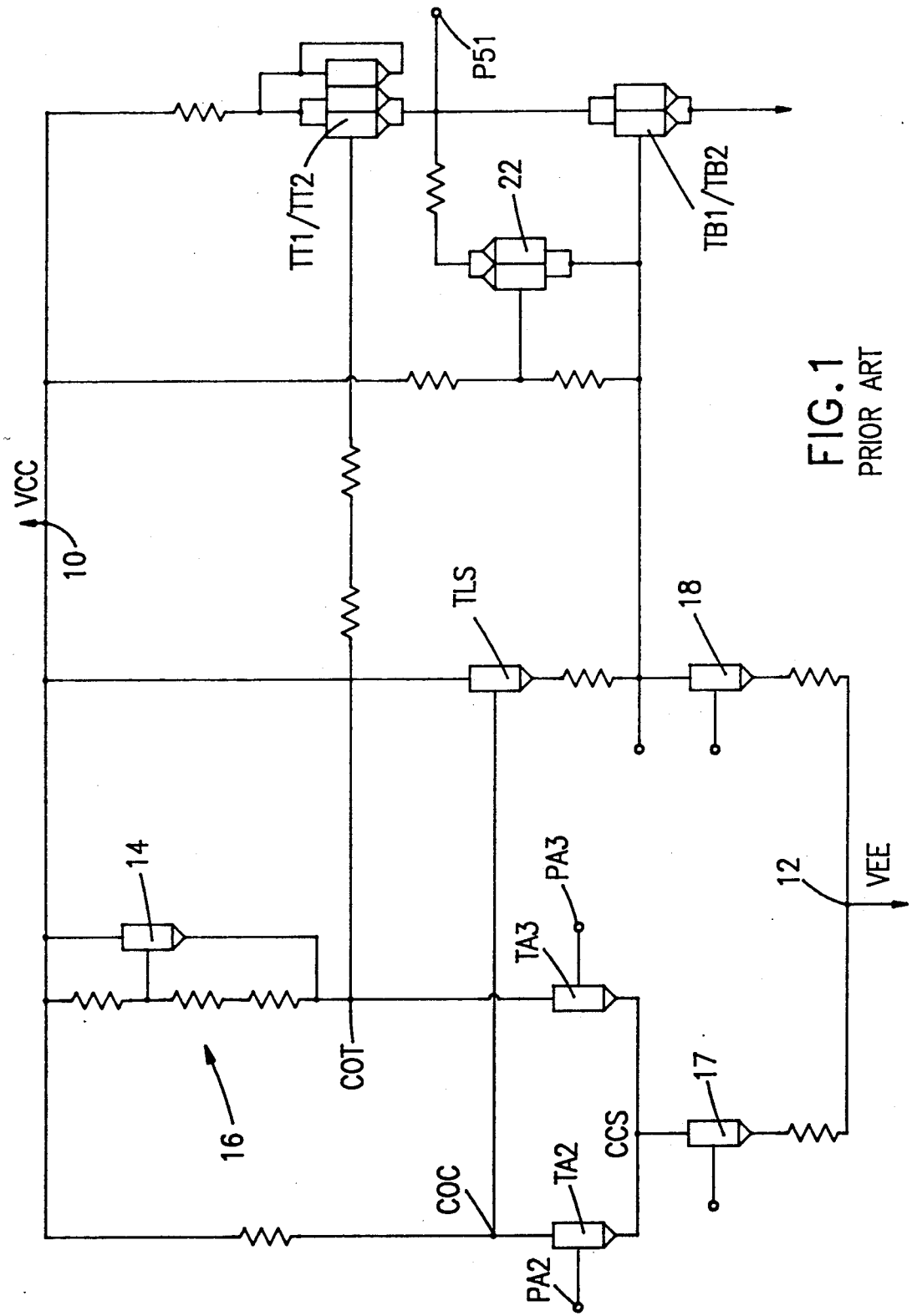
FIG. 1 is a schematic drawing of a prior art push-pull driver of the type to which the teachings of this invention apply.
Figure 2:
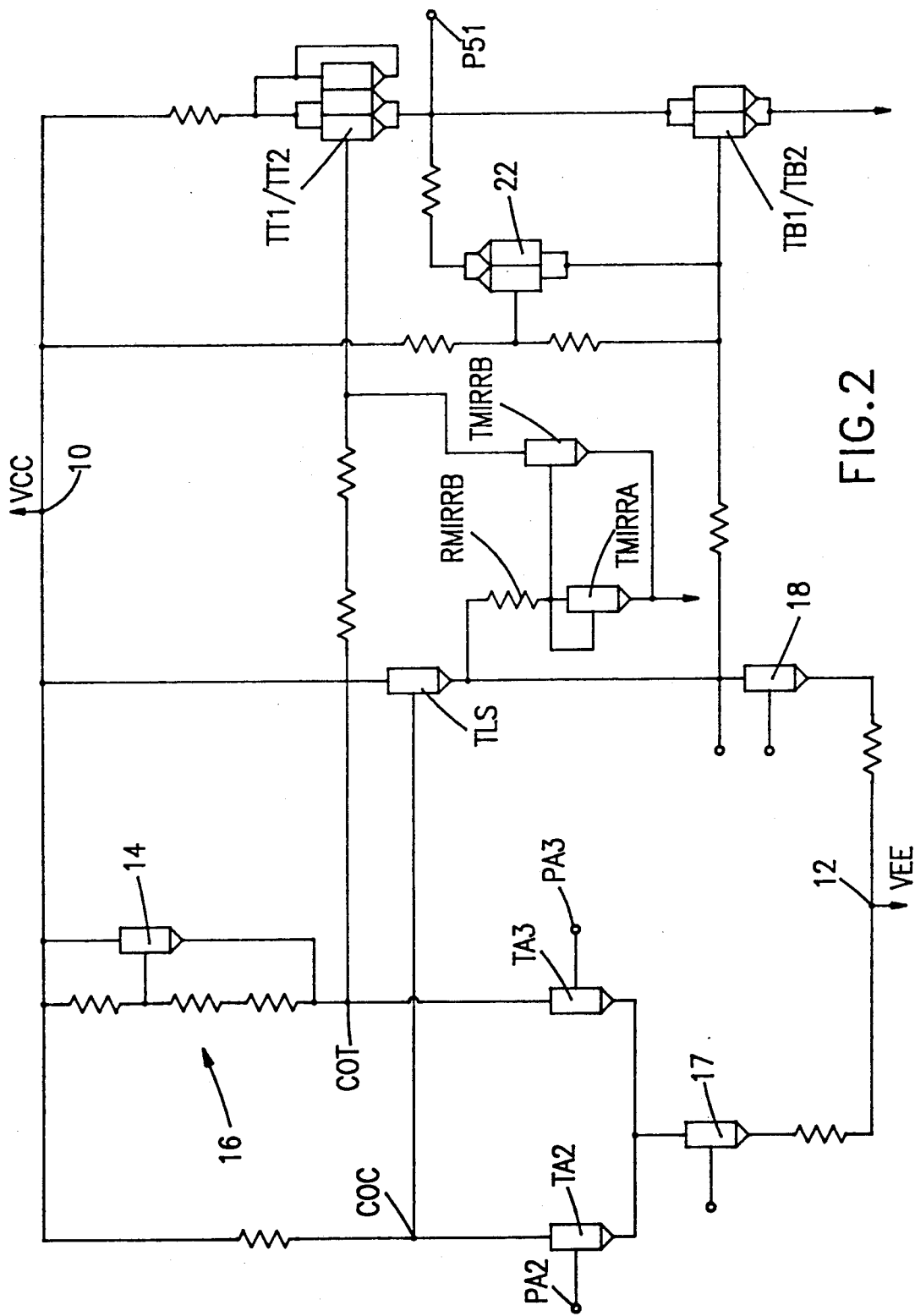
FIG. 2 is a schematic drawing of a push-pull driver in accordance with the teachings of this invention.

Referring now to FIG. 2, the basic push-pull driver circuit in this specific embodiment of the invention is functionally similar to that shown in FIG. 1 and like reference numerals have been used to designate like components. Complementary inputs may be coupled to PA2 and PA3. Alternatively a single input may be coupled to PA3 and PA2 coupled to a fixed reference potential. In accordance with this invention, the voltage at node COT when TA3 is "on" is raised (e.g., on the order of 300 mv) in order to bias TA3 so that it operates in a region where the PA3—COT junction is away from saturation.

In this embodiment of the invention, a current mirror circuit comprised of transistor TMIRRA and resistor RMIRRB establishes a current which is mirrored to transistor TMIRRB in order to pull down the base of transistor pair TT1/TT2 below COT in order to turn off completely this transistor pair. The current through transistor TMIRRB is regulated by the current mirror TMIRRA and RMIRRB which in turn is controlled by the node COC, which is always complimentary to node COT. When input PA2 is high, transistor TA2 turns "ON" and transistor TA3 turns off, node COC is low enough to shut off the current mirror, hence allowing node BT to follow VCC during an upgoing transition and turn on TT1/TT2.

When input PA3 is high, node COT is low, and node COC high. This results in turning on the "current mirror" transistor TMIRRA and node BT is pulled down further than node COT to completely shut off the top output device. The amount of current through the current mirror is controlled by the emitter voltage of transistor TLS and the collector resistor RMIRR of TMIRRA.

Figure 3:
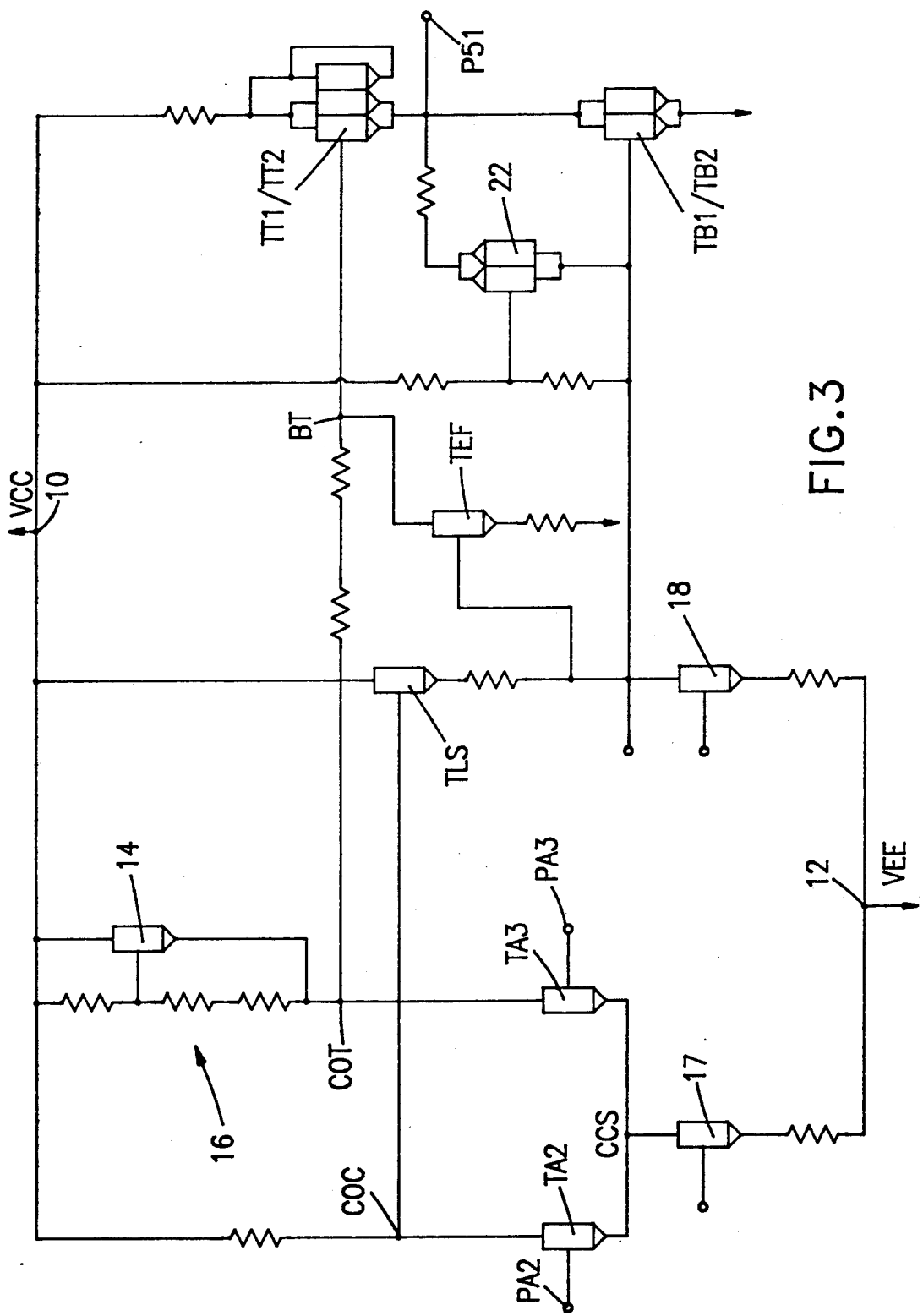
FIG. 3 is a schematic drawing of an alternative embodiment of the invention.

Referring now to FIG. 3, this embodiment of the invention is similar to that shown in FIG. 2 and again like references have been used to identify like components in the two drawings. Here an transistor TEF is used to pull down the upper transistor pair base node BT. Transistor TEF coupled to node COC and turns on when TA3 turns on and turns off when TA3 turns off.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. In a push-pull driver circuit having a first and a second bipolar switching transistor, said first switching transistor having a base coupled to an input terminal, a first and a second bipolar output transistor, said first output transistor having a base coupled to said first switching transistor, said second output transistor having a base coupled to said second switching transistor, the improvement comprising:

means for biasing said first switching transistor so that said first switching transistor operates away from saturation;

means switchable between an on state and an off state coupled to the base of said first output transistor to provide a current sink to lower said base of said first output transistor to a potential sufficient to cut-off conduction in said first output transistor when said switchable means is on; and means coupling said switchable means to said second switching transistor to close said switchable means when said first input transistor closes and to open said switchable means when said first transistor switch opens.

2. In a push-pull driver circuit as in claim 1, wherein said switchable means includes a bipolar transistor.

3. In a push-pull drive circuit as in claim 1, wherein said switchable means includes a pair of bipolar transistors coupled to form a current mirror.

* * * * *